United States Patent

Furukawa et al.

[11] Patent Number: 5,981,977
[45] Date of Patent: Nov. 9, 1999

[54] NITRIDE COMPOUND SEMICONDUCTOR LIGHT EMITTING ELEMENT AND ITS MANUFACTURING METHOD

[75] Inventors: Chisato Furukawa, Atsugi; Hideto Sugawara, Kawasaki; Masayuki Ishikawa; Nobuhiro Suzuki, both of Yokohama, all of Japan

[73] Assignee: Kabushiki Kaisha Toshiba, Tokyo, Japan

[21] Appl. No.: 09/110,834

[22] Filed: Jul. 6, 1998

[30] Foreign Application Priority Data

Jul. 4, 1997 [JP] Japan .................................. 9-179489

[51] Int. Cl.⁶ .................................................. H01L 33/00
[52] U.S. Cl. ................................ 257/94; 257/95; 257/96; 257/97; 257/103; 372/44; 372/45; 372/46; 372/48
[58] Field of Search ................................. 257/94, 96, 97, 257/103, 95; 372/44, 45, 46, 48

[56] References Cited

U.S. PATENT DOCUMENTS

| | | | |
|---|---|---|---|
| 4,251,298 | 2/1981 | Thompson | 148/171 |
| 4,694,311 | 9/1987 | Rezen et al. | 357/17 |
| 4,908,830 | 3/1990 | Yoshida et al. | 372/46 |
| 5,438,585 | 8/1995 | Armour et al. | 372/45 |

FOREIGN PATENT DOCUMENTS 61-252674  11/1986  Japan ........................ 257/95

OTHER PUBLICATIONS

Kirkby et al., "Channelled Substrate Buried Heterostructure (GaAl) As Injection Lasers," Electro–Optics/Laser Mar. 1976.

International '76 UK, Brighton, Sussex, England, Mar. 9–11, 1976, pp. 1–3.

Primary Examiner—William Mintel
Attorney, Agent, or Firm—Loeb & Loeb LLP

[57] ABSTRACT

A nitride compound semiconductor light emitting element comprises a substrate, a nitride compound semiconductor n-type layer, a mask layer having a predetermined opening, a nitride compound semiconductor buffer layer epitaxially grown on said n-type layer exclusively at said opening. The buffer layer has a recess on its top face so that a thickness of said buffer layer is thinner above a central portion of the opening and thicker above edge portions of the opening. A nitride compound semiconductor active layer is selectively formed on the recess of the buffer layer to be thicker at the central portion of the recess and thinner at the edges of the recess. A nitride compound semiconductor burying layer overlays the mask layer and the active layer to cover the active layer. By selectively growing the buffer layer and the active layer in the opening of the mask layer formed on the substrate and by growing additional layers to bury the entire structure and to flatten the surface, a planar-type, stripe-buried structure is realized. The active layer has a distribution of refractive index due to the distribution of thickness resulting from the selective growth and can confine light with high efficiency. Additionally, by using an insulation film, highly efficient confinement of current is realized to provide a light emitting element for a shorter wavelength with a high luminous intensity and a low oscillation threshold value.

18 Claims, 6 Drawing Sheets

NITRIDE COMPOUND SEMICONDUCTOR LIGHT EMITTING ELEMENT AND ITS MANUFACTURING METHOD

BACKGROUND OF THE INVENTION

This invention relates to a nitride compound semiconductor light emitting element and its manufacturing method. More particularly, the invention relates to a nitride compound semiconductor light emitting element having a high confinement efficiency for light and carrier and suppressing leak current, and a method for manufacturing same.

Nitride compound semiconductors are of direct-transition type and are capable of highly efficient radiation recombination in almost all composition range. Their transition energy widely ranges from 1.89 to 6.2 eV, depending on the composition. Because of these advantageous characteristics, light emitting elements using nitride compound semiconductors are expected to be useful elements for intense emission especially in short wavelength range in various fields of application.

In the present application, the term "nitride compound semiconductor" pertains to any semiconductor which can be expressed by the chemical formula $B_xIn_yAl_zGa_{1-x-y-z}N$ ($0 \leq x \leq 1$, $0 \leq y \leq 1$, $0 \leq z \leq 1$, $x+y+z \leq 1$) with any values of the mole fractions x, y and z in their respective ranges. For example, InAlN (x=0, y=0.4, z=0.6) has been identified as one the of nitride compound semiconductors.

Conventional nitride semiconductor light emitting devices, in general, have a multi-layered structure made by sequentially growing flat layers of various nitride compound semiconductor crystals on a flat substrate of sapphire, or the like. For example, a double-heterostructure representative as a semiconductor light emitting element is made by sequentially stacking a cladding layer, active layer and cladding layer on a substrate via an appropriate buffer layer. Such a double-heterostructure can effectively confine injected carriers and light generated in the active layer, and is indispensable especially for fabricating a high-performance semiconductor laser.

A high-performance semiconductor laser cannot be realized only by using a double-heterostructure. It is also necessary to confine the current and light in the active layer with high efficiency. However, conventional light emitting elements using nitride compound semiconductors could not ensure such a high efficiency in confinement of current and light. Details about this problem are explained below.

For efficient confinement of current, the active layer stacked as a flat layer must be processed to form a structure for concentrating the current. The most popular process used for the purpose relies on processing the active layer into a narrow mesa configuration and burying it in a layer or layers made by subsequent crystal growth. In the case of forming light emitting devices with nitride compounds, if dry etching is used for processing the active layer into the form of a stripe in nitride light emitting elements, it often damages the etched surface and fails to realize good current characteristics. Wet etching is less harmful to the etched surface, but there has been no appropriate wet etching process suitable for nitride compound semiconductors.

Another problem with nitride compound semiconductors lies in the difficulty in growing layers for burying the mesa-shaped active layer. Even if the mesa-shaped active layer can be buried incompletely, it tends to result in irregular growth and to cause leakage of current.

Under circumstances it is difficult to effectively confine current in conventional light emitting elements using nitride compound semiconductors.

Additionally, confinement of light is also difficult in conventional light emitting element using nitride compound semiconductors. That is, the refractive index of the active layer must be as high as possible relative to the cladding layer to ensure efficient confinement of light in the active layer. To realize a high refractive index of a nitride compound semiconductor, the mole fraction of indium in the nitride compound semiconductor must be high. However, as the mole fraction of indium increases, the crystallographic quality of the semiconductor degrades unacceptably to maintain characteristics required for the active layer.

Moreover, in the case of metal-organic chemical vapor deposition (MOCVD) widely used for growth of nitride compound semiconductors, the temperature must be low during crystal growth to ensure a high mole fraction of indium. However, such a low growth temperature causes further deterioration in crystalline quality and degrades various characteristics of the resulting light emitting element. That is, conventional techniques cannot not realize highly efficient laser oscillation and emission of shorter wavelengths with nitride semiconductor light emitting devices by increasing the mole fraction of indium.

SUMMARY OF THE INVENTION

It is therefore an object of the invention to provide a nitride compound semiconductor light emitting device and its manufacturing method which realize a structure for efficient confinement of current and light.

According to the invention, there is provided a nitride compound semiconductor light emitting element comprising: a substrate; a mask layer formed on said substrate and having a predetermined opening; a nitride compound semiconductor buffer layer selectively grown above said opening in a distribution of the thickness to be thinner near the center of said opening and thicker at opposite edge portions; a nitride compound semiconductor active layer selectively grown on said buffer layer in a distribution of thickness to be thicker near the center of said opening and thinner at opposite edge portions; and a nitride compound semiconductor burying layer grown on said mask layer and said active layer to bury said active layer. The element can confine electric current and light with remarkably high efficiency, and realizes high luminous intensity, low oscillation threshold value and a shorter wavelength.

When a nitride compound semiconductor is stacked on the entire surface of the mask layer formed on a substrate and having a predetermined opening, it is possible to control mole fractions of the active layer at the location of the opening and to confine light efficiently.

The mask layer may be made of an electrically insulating material to confine electric current as well.

If the buffer layer is selectively grown above the opening in the mask layer on the substrate and may be continued for a longer duration of time. As a result, the buffer layer is stacked to project in the form of a pyramid above the opening and makes a distribution of thickness thicker in a location above the central portion of the opening and thinner in locations above opposite edges of the opening. The cladding layer and the active layer grown on the buffer layer can be stacked thick and vary in composition in the location above the central portion of the opening. Thus, the active layer can confine current and light efficiently.

The growth temperature used here is preferably in the range of 600 to 1200° C.

For growing the burying layer, a polycrystalline gallium nitride layer may be stacked at a temperature in the range of 400 to 600° C., and subsequently re-crystallized into a single-crystal film by increasing the temperature higher than 600° C.

The invention are embodied in the aforementioned forms, and has various effects shown below.

The active layer selectively grown in the opening of the insulation film can confine current with a remarkably high efficiency, and promises a nitride compound semiconductor light emitting element with a high luminous intensity and a low oscillation threshold value.

The active layer can be controlled in composition by utilizing the unevenness along the grown surface. As a result, a region with a high refractive index can be made easily in a central portion of the active layer, and light can be confined within the active layer with a remarkably high efficiency. Therefore, a nitride compound semiconductor light emitting element for a shorter wavelength with a high luminous intensity and a low oscillation threshold value can be provided.

The invention also makes it possible to grow a crystal with a high mole fraction of indium, maintaining a high growth temperature. Therefore, the mole fraction of indium in the active layer can be increased while maintaining its crystallographic property.

The mole fraction of indium in the active layer can be controlled easily by utilizing the unevenness along the substrate surface. Therefore, the effect of confinement of light and current can be determined as desired within the active layer.

The invention can stack the buffer layer of a polycrystalline nitride compound semiconductor on an insulation film under a low temperature and can thereafter increase the temperature to re-crystallize the buffer layer into a single-crystal film. Therefore, any nitride compound semiconductor can be epitaxially grown on an insulation film.

Another feature of the invention is that the double-heterostructure is formed inside the stripe opening of the mask layer so that the active layer is interposed between the two opposite edges of the mask layer. The light emitted from the active layer is strongly confined along the planar direction because the active layer is interposed between the two opposite edges of the mask layer which has much larger refractive index. As a result, a highly controlled transverse mode emission is realized. This is especially advantageous for the data reading and data writing applications such as DVD (digital versatile disc) and CD(compact disc).

As summarized above, according to the invention, a nitride compound semiconductor light emitting element capable of confining current and light with a high efficiency can be obtained in a simple manufacturing process, and the industrial merit of the invention is great.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DETAILED DESCRIPTION OF THE PREFERRED EMBODIMENTS

Explained below are embodiments of the invention with reference to the drawings.

Figure 1A:
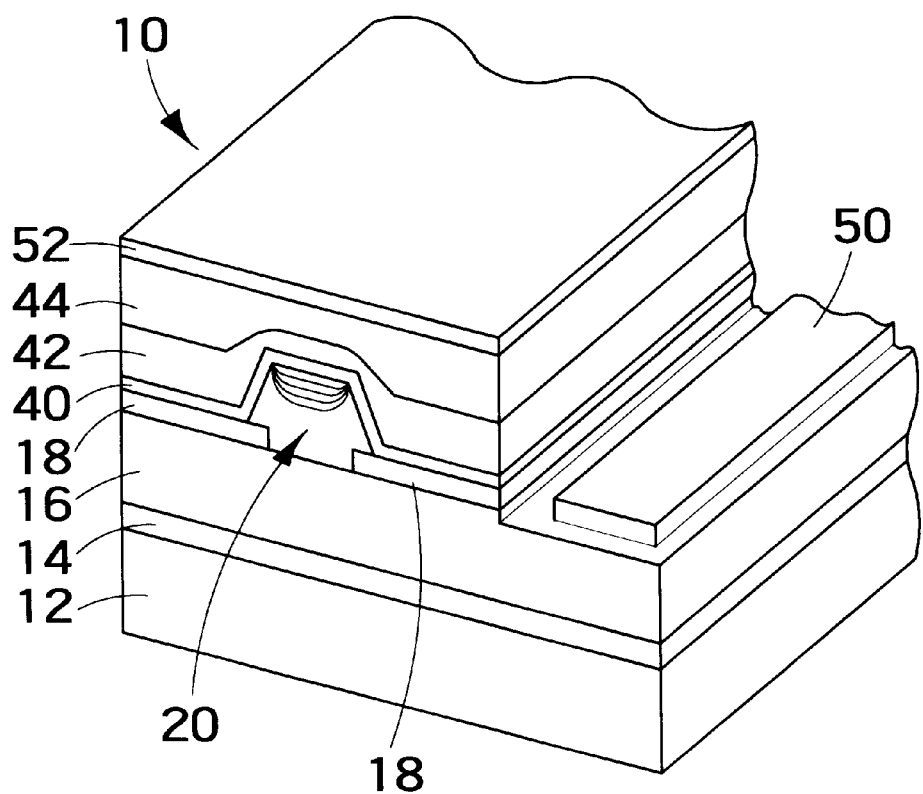
FIGS. 1A and 1B are, respectively, a perspective view and a fragmentary side elevational view schematically showing construction of a nitride compound semiconductor light emitting element embodying the invention.
Figure 1B:
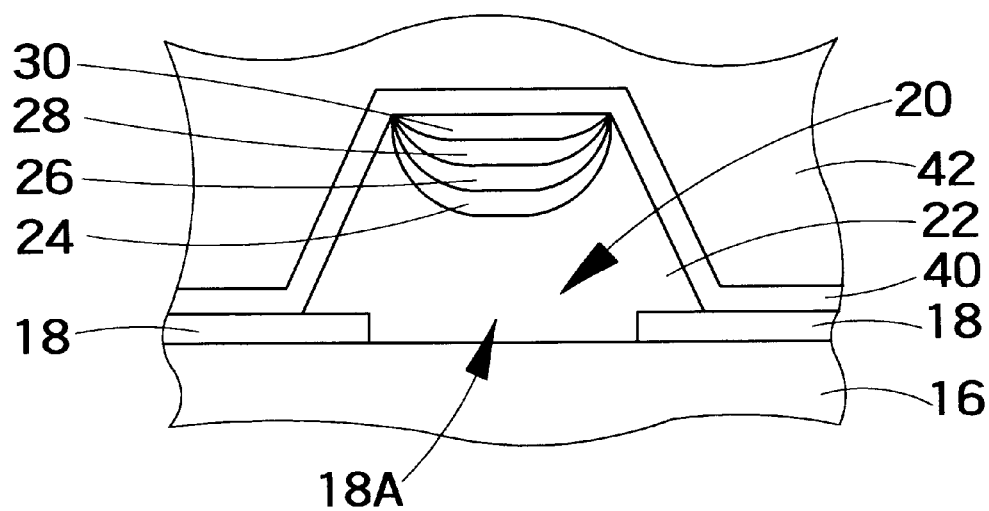

FIGS. 1A and 1B are diagrams schematically showing construction of a nitride compound semiconductor light emitting element embodying the invention. FIG. 1A is a perspective view, and FIG. 1B is a fragmentary side-elevational view of the part around an active layer. The light emitting element 10 according to the invention has a multi-layered structure made by sequentially stacking a plurality of semiconductor layers on a substrate 12. The multi-layered structure includes a first buffer layer 14, n-type layer 16 and mask layer 18 stacked on the substrate 12 in sequence.

The substrate 12 may be a sapphire wafer, for example. The buffer layer 14 may be gallium nitride, and the n-type layer 16 may be n-type gallium nitride. The mask layer 18 may be made of silicon oxide, silicon nitride, aluminum oxide, silicon carbide, or aluminum nitride. Its thickness is preferably within 100 to 700 nm.

The mask layer 18 has a stripe-shaped opening 18A near the center of the element. Formed above the opening 18A is a selectively-grown region 20 including layers 22 through 30. FIG. 1B shows the selectively-grown region 20 in an enlarged scale. As shown here, an n-type buffer layer 22, n-type cladding layer 24, active layer 26, p-type cladding layer 28 and p-type buffer layer 30 are selectively grown on the selectively-grown region 20.

The n-type buffer layer 22 may be made of n-type GaN, n-type cladding layer 24 of n-type GaAlN, active layer 26 of GaInN, p-type cladding layer 28 of p-type GaAlN, and p-type buffer layer of p-type GaN. The n-type buffer layer 22 functions as a buffer layer for the selective growth in the opening 18A of the mask layer 18. The p-type buffer layer 30 functions to bury and smooth any unevenness on the grown surface in the selectively-grown region.

A second buffer layer 40, p-type burying layer 42 and p-type contact layer 44 are stacked on the mask layer 18 and the selectively-grown region 20. These layers may be made of gallium nitride, respectively.

The multi-layered structure formed on the substrate 12 is selectively removed to a depth sufficient enough to expose the n-type layer 16, and an n-side electrode 50 is formed on the n-type layer 16. A p-side electrode 52 is formed on the p-type contact layer 44. A protective film may be formed to cover their surfaces, if necessary.

According to the invention, since the mask layer 18 is formed around the active layer 20, and the entirety is buried by growth of layers, a so-called internal stripe-shaped planar structure is realized. This structure promises highly efficient current confinement while suppressing leakage of current in the light emitting element.

Additionally, by using the mask layer 18 as a mask for the selective growth in the opening 18A, the invention ensures growth of the active layer having a predetermined thickness distribution in the region. The distribution in thickness is caused by a difference in the growth rate of the active layer from place to place, explained later in greater detail. It results in a difference in mole fraction of indium in the active layer from place to place.

That is, the mole fraction of indium in the active layer is lower in locations where the growth rate is slower, and higher in the location near the center of the active layer where the growth rate is faster. By utilizing the specific distribution of the thickness and the mole fraction of indium in the active layer, it is possible to increase the refractive index and the light confinement efficiency at the central portion of the active layer.

Next explained is a process for manufacturing the light emitting element according to the invention.

FIGS. 2A through 2D are cross-sectional views of the nitride compound semiconductor light emitting element under different steps in a manufacturing process. First with reference to FIG. 2A, the first buffer layer 14 and the n-type layer 16 are grown in sequence on the substrate 12. Any of metal-organic chemical vapor deposition (MOCVD), chemical beam epitaxy (CBE), hydride vapor phase epitaxy, or the like, may be used for the growth. The process is explained below as using MOCVD.

Particularly when the first buffer layer 14 is grown, growth is achieved using a low growth temperature to ensure good quality of the epitaxially grown layer.

Figure 2A:
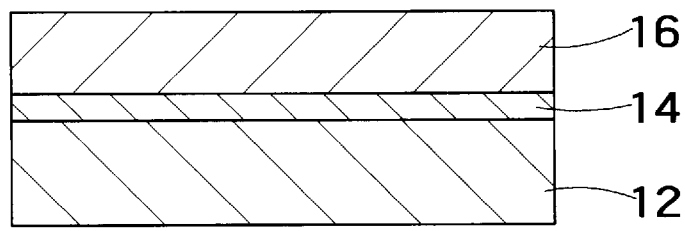
FIGS. 2A through 2D are cross-sectional fragmentary views schematically showing the nitride compound semiconductor light emitting element according to the invention under different steps of a manufacturing process.
Figure 2B:
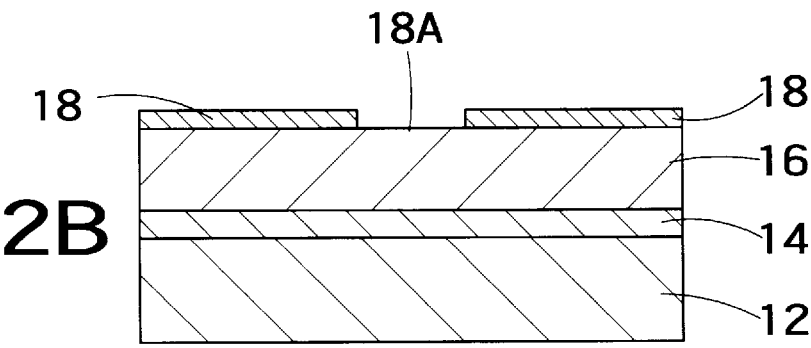

Next referring to FIG. 2B, the mask layer 18 is stacked and partly removed to make the stripe-shaped opening 18A in the central portion. Thermal CVD, plasma CVD, sputtering, or the like, may be used for stacking the mask layer 18.

Figure 2C:
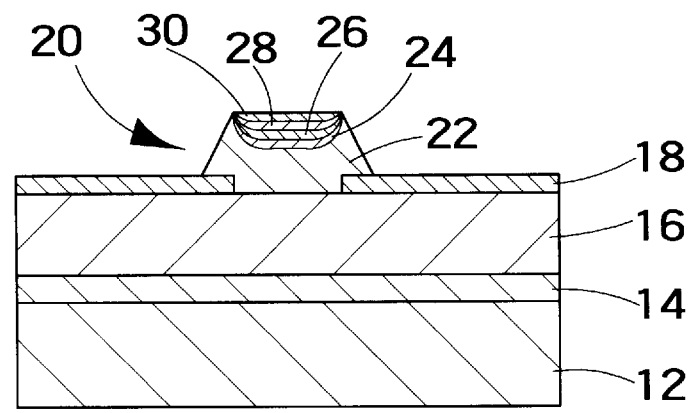

Next referring to FIG. 2C, there follows selective growth of layers in and on the opening 18A. That is, the n-type layer 22, n-type cladding layer 24, active layer 26, p-type cladding layer 28 and p-type layer 30 are selectively grown in sequence by MOCVD or another appropriate growth technique.

The Inventors found optimum conditions for the selective growth. That is, desirable growth temperatures of cladding layers 24 and 28 are in the range from 600 to 1200° C., and that of the active layer 26 containing indium is in the range from 600 to 900° C. Growth temperatures in these ranges promote selective crystalline growth only in and on the aperture 18A in the mask layer 18 and not on the mask layer 18.

Therefore, on the mask layer 18, the supply of the source material runs to excess during the crystalline growth. As a result, the growth rate of the n-type layer 22, first grown, is faster and faster as being nearer to opposite edges of the opening 18A, and the its grown surface does not become flat. That is, as shown in FIG. 2C, the buffer layer 22 exhibits the surface configuration projecting in the form of dual peaks at opposite edges with a lower growth rate and arcuately depressed in the central portion from the dual peaks. The cladding layer 24 and the active layer 26 subsequently stacked on the n-type layer 22 are less affected by the excessive supply of the source material on the surrounding mask layer, and their growth progresses, gradually flattening the surface configuration of the n-type layer 22. That is, the depth of the central depression in the n-type layer 22 becomes shallower while the cladding layer 24, active layer 26, cladding layer 28 and p-type layer 30 are stacked on the n-type layer 22, and the unevenness of the surface configuration is alleviated and flattened.

Considering a cross-sectional configuration of the active layer 26 grown in this manner, the growth rate of the active layer 26 is faster in its central portion than in its opposite edge portions. In MOCVD, the mole fraction of indium tends to become higher as the growth rate increases. Therefore, the mole fraction of the active layer 26 is higher in its central portion than in the peripheral portion. The active layer 26 has a distribution with a higher refractive index in the central portion, and can confine light efficiently.

That is, according to the invention, by utilizing the particular diffusion of the growth rate for selective growth, the light confinement efficiency of the active layer can be improved. Moreover, since the invention controls the distribution of the mole fraction of indium in the active layer by using the unique unevenness of the grown surface, a crystal with a relatively high mole fraction of indium can be grown even under a relatively high temperature.

In conventional techniques, the mole fraction of indium could not be increased without lowering the growth temperature, but a lower temperature made it difficult to obtain a good crystallographic quality. In contrast, the invention enables the use of a relatively high growth temperature for growing a crystal with a higher mole fraction of indium and nevertheless promises a high crystallographic quality.

Additionally, according to the invention, the stripe-shaped active layer 26 is electrically insulated by the mask layer 18. Therefore, the injected current can be confined within the active layer 26 with a high efficiency.

Figure 2D:
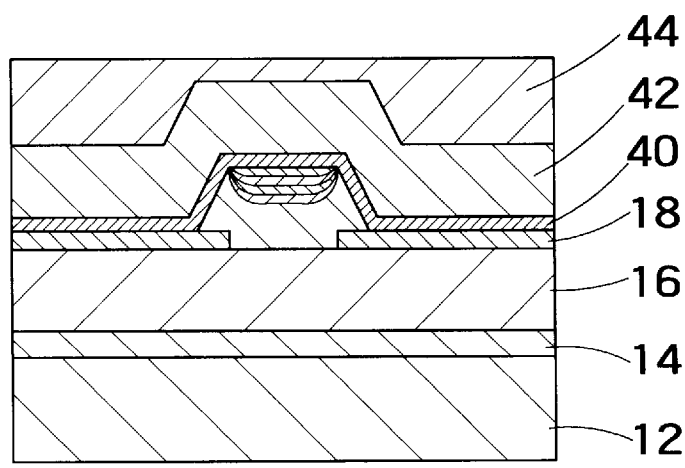

Next referring to FIG. 2D, crystal growth for burying the entirety is executed. That is, the second buffer layer 40, p-type layer 42 and p-type contact layer 44 are grown sequentially to smooth the surface. The Inventors have experimentally found that the second buffer layer 40 can be stacked stably on both the mask layer 18 and the selectively-grown region 20 by setting the growth temperature in the range of 400 to 600° C. At any higher growth temperature, the crystal cannot be stably stacked on the mask layer 18. At any lower growth temperature, thermal decomposition of the source material gas is insufficient, and the source material is not supplied sufficiently.

Through further researches and studies of the Inventors, the buffer layer 40 obtained in this range of temperatures was proved to first exhibit a polycrystalline state and re-crystallizes into a single crystal when the growth temperature was elevated to 1000 through 1200° C. for the growth of the p-type layer 42 thereon. The thickness of the buffer layer 40 is preferably 10 to 100 nm because the buffering effect is insufficient with a smaller thickness, and re-crystallization is difficult to obtain with a larger thickness.

As shown in FIG. 2D, when the buffer layer 40, p-type layer 42 and p-type contact layer 44 are grown sequentially, they bury the selectively-grown region 20 and flatten the wafer surface.

Finally, as shown in FIG. 1A, the layers are partly removed by etching to expose the surface of the n-type layer 16. Thereafter, the n-side electrode 50 and the p-side electrode 52 are formed. Where appropriate, a projected film and/or an anti-reflection film, both not shown, may be stacked.

After a series of steps explained above, the planar-structured, stripe-buried semiconductor laser element is obtained.

According to the invention, the structure capable of efficiently confining current and light can be realized easily by the effective growth of layers in the opening 18A of the mask layer 18. Additionally, the selectively-grown region can be buried easily to readily realize a planar-type stripe-buried laser.

The width of the opening 18A in the mask layer 18 is an important parameter for efficient confinement of current and light within the active layer 26. The width of the opening 18A is preferably not larger than 20 μm in most cases. For a higher efficiency of confinement, the width is preferably not larger than 5 μm. The optimum width of the opening for the inside-stripe structure has been experimentally proved to be 0.5 through 1.5 μm by the Inventors.

Next explained is a modification example of the invention.

Figure 3A:
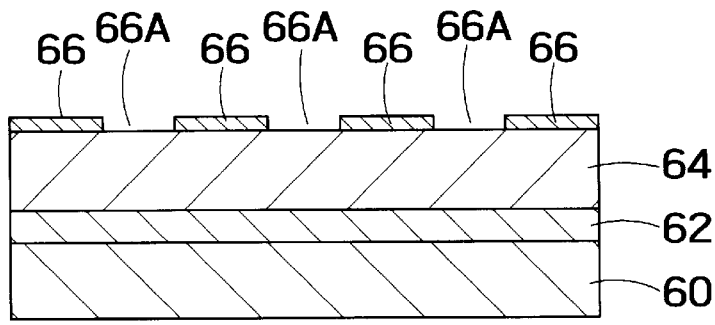
FIGS. 3A through 3C a cross-sectional views of a modified semiconductor light emitting element according to the invent under different steps of a manufacturing process.
Figure 3B:
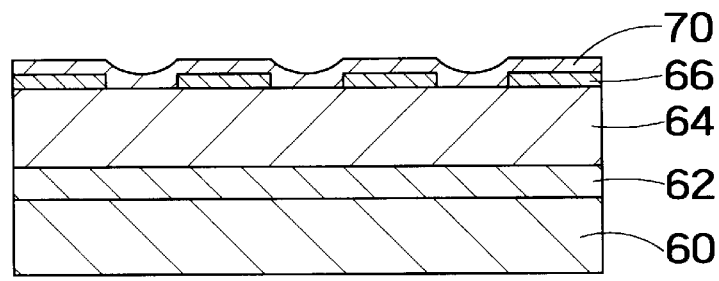
Figure 3C:
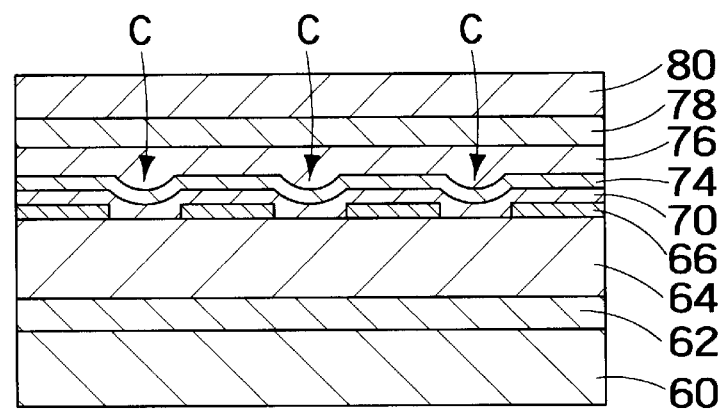

FIGS. 3A through 3C are cross-sectional views schematically showing a semiconductor light emitting element according to the invention under different steps of a manufacturing process. The light emitting element shown here is made by stacking a buffer layer 62 and an n-type layer 64 on a substrate 61 and by making an insulation film mask 66. The insulation film mask 66 has openings 66A of a predetermined pattern, preferably periodical, such as parallel stripes, polka dots, mesh, or the like. However, the openings need not be a repetition of a predetermined configuration, but may be different in configuration and/or diameter from each other.

Stacked on the insulation film mask 66 is a second buffer layer 70. The surface of the second buffer layer 70 has depressions in accordance with the pattern of the openings in the insulation film mask 66 as illustrated. Stacked on the buffer layer 70 are an n-type cladding layer 74, active layer 76, p-type cladding layer 78 and p-type contact layer 80 in sequence. The n-type cladding layer 74 may be made of AlGaN, the active layer 76 of AlInGaN, the p-type cladding layer 78 of AlGaN, and the p-type contact layer 80 of GaN.

These crystal layers stacked on the buffer layer 70 smooth the surface, gradually burying the depressions on the buffer layer 70. That is, the growth rate of the active layer 76 is faster in central portions of the depressions on the buffer layer 70 shown at C in FIG. 3C than in the other portions. As a result, the active layer 76 has a higher mole fraction of indium in the depressions on the buffer layer 70, and it results in increasing the refractive index and improving the light confinement efficiency.

That is, according to the invention, the mole fraction of the active layer can be intentionally varied along the plane in accordance with the pattern of the openings in the insulation film. Nevertheless, deterioration caused by the surface condition, if any, is very small because the wafer surface is finally smoothed substantially upon completion of the growth.

Moreover, since the mole fraction of indium can be controlled by using the unevenness of the grown layer as explained above, a crystal with a higher mole fraction of indium can be obtained even under a relatively high growth temperature. When the growth temperature is 900° C., for example, the mole fraction of indium in a crystal grown by MOCVD is 2% to 3% maximum with conventional techniques. However, the invention can increase it 10% maximum in depressions on the grown surface.

The above example has been explained as using the insulation film mask 66, but the invention is not limited to it. For example, an n-type GaN layer may be used as a mask instead of the insulation film so as to form similar openings and to stack crystal layers thereon.

Next explained is another modified example of the invention.

FIGS. 4A through 4D are cross-sectional views schematically showing a light emitting element according to the invention under different steps of a manufacturing process.

Figure 4A:
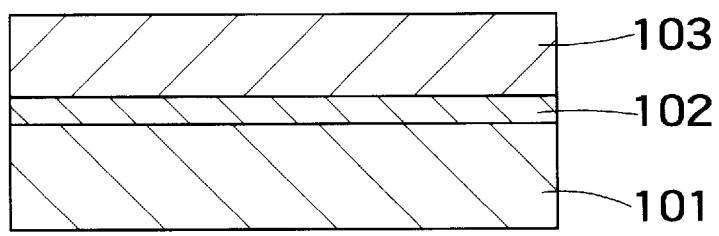
FIGS. 4A through 4D are cross-sectional views of another modified semiconductor light emitting element according to the invention under different steps of a manufacturing process.

Here again, the light emitting element is made by first stacking a buffer layer 102 and an n-type layer 103 on a substrate 101 as shown in FIG. 4A. The substrate 101 may be a sapphire wafer having a c-plane as its major surface. The buffer layer 102 may be a GaN layer grown by MOCVD while supplying trimethyl gallium (TMG) and ammonium (NH$_3$). Similarly, the n-type layer may be an n-type GaN layer grown by supplying TMG, N$_H$ and silane (SiH$_4$) under a growth temperature from 1000 to 1200° C. The carrier gas used for MOCVD may be nitrogen, hydrogen, or their mixed gas, for example.

Figure 4B:
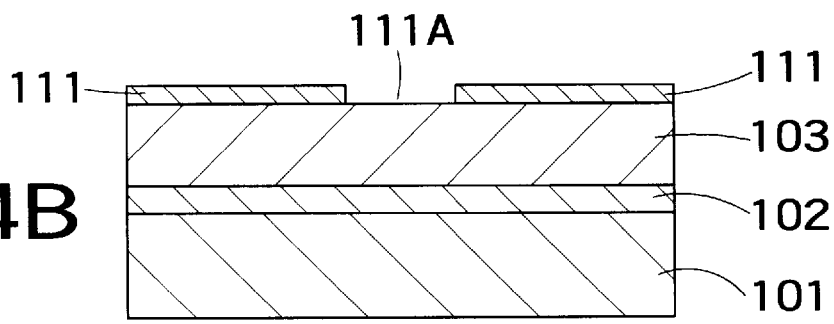

Next referring to FIG. 4B, an insulation film 111 is stacked and patterned to make an opening 111A. The insulation film 111 may be made of silicon oxide, silicon nitride or aluminum oxide, for example. Also usable are silicon carbide and aluminum nitride. The process for stacking the insulation film may be performed by using thermal CVD, plasma CVD or sputtering, for example.

Figure 4C:
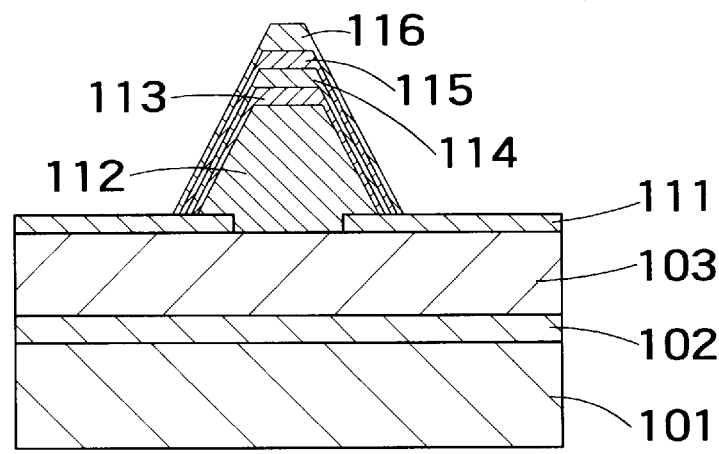

Next referring to FIG. 4C, an n-type layer 112 is grown selectively. The n-type layer 112 may be GaN, for example. The growth temperature is preferably selected from a range of 600 to 1200° C., as in FIGS. 1A and 1B, and more preferably selected from the range of 1000 to 1200° C. for a higher crystallographic quality. The time for the growth is set longer than the case of FIGS. 1A and 1B to continue the growth until the selectively-grown region represents a convex configuration.

Figure 5A:
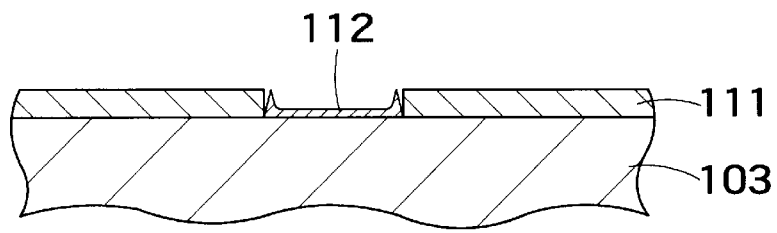
FIGS 5A through 5D are diagrams schematically showing aspects of select growth of an n-type layer 112.
Figure 5B:
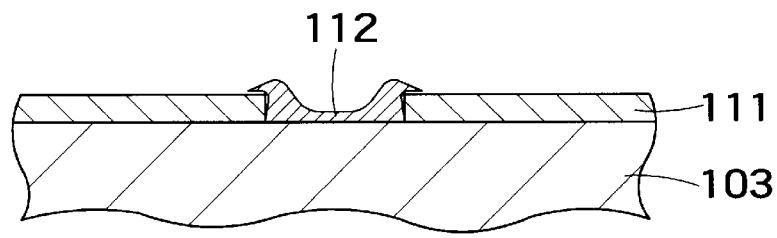

FIGS. 5A through 5D are schematic diagrams showing aspects of the selective growth of the n-type layer 112. During the selective growth, the crystal grows only in the opening 111A of the insulation film 111, and an excessive amount of the source material remains non-stacked above the surface of the insulation film 111 as explained before. As a result, at opposite edge portions of the opening 111A where an excessive amount of the source material from above the surface of the insulation film 111, the growth rate increases, and the n-type layer 112 exhibits a surface configuration with opposite edges projecting high and the central portion depressed low as shown in FIGS. 4A and 5B.

Figure 5C:
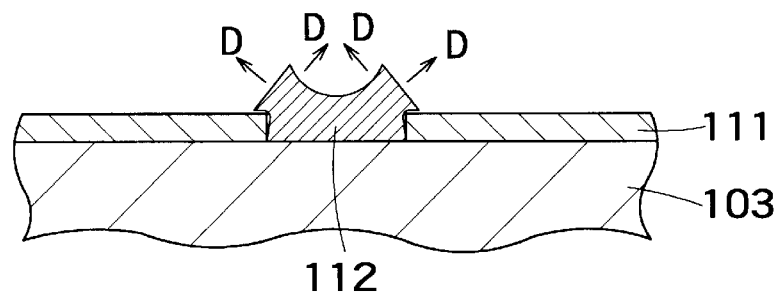

However, when gallium nitride is grown on the c-plane of the sapphire substrate, as the growth progresses, projecting portions at opposite edges of the opening 111A preferentially grow in directions shown by arrows D in FIG. 5C. The directions shown by arrows D are preferred growth orientations where crystal growth of gallium nitride is more liable to progress than other crystalline orientations. These crystalline orientations are called preferred growth orientations.

As the growth progress in the preferred growth orientations, the depression above the center of the opening gradually becomes smaller and smaller, and finally disappears. As a result, the selective growth region comes to exhibit a pyramidal cross-sectional configuration. For example, if the opening is circular, the selectively-grown layer finally exhibits a configuration resembling a hexangular pyramid.

Figure 5D:
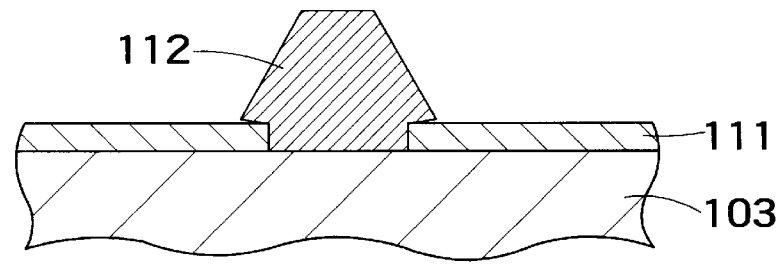

In the present invention, the growth of the selectively-grown region 112 is not continued until it becomes completely pyramidal, but it is stopped when the upper surface becomes substantially flat as shown in FIG. 5D.

Referring, again to FIGS. 4A through 4C, in the next step shown in FIG. 4C, an n-type cladding layer 113, active layer 114, p-type cladding layer 115 and p-type layer 116 are selectively grown on the selectively-grown layer 112 sequentially. Materials of these layers may be, for example, AlGaN for the n-type cladding layer 113, InGaN for the active layer 114, AlGaN for the p-type cladding layer 115 and GaN for the p-type layer 116. The active layer 114 may be a multiple-quantum well (MQW) layer. Considering a cross-sectional configuration of the active layer 114 as shown in FIG. 4C, the top flat portion of the selectively-grown region is surrounded by preferred growth orientations, and largest in thickness. That is, the growth rate of the active layer 26 is fastest in its top portion. As a result, the mole fraction of indium in the active layer is highest in the top portion of the selective growth region.

MOCVD may be used for the series of steps of growth, setting the growth temperature in the range of 600 to 900° C. for layers containing indium and in the range of 600 to 1200° C. for other layers. Trimethyl aluminum (TMA) may be supplied in addition to the gases indicated before for layers containing aluminum, and trimethyl indium (TMI) may be supplied similarly for layers containing indium. Usable as the dopant for growing p-type layers is bis-cyclopentadienile-magnesium ($Cp_2Mg$) or dimethyl zinc (DMZ).

Figure 4D:
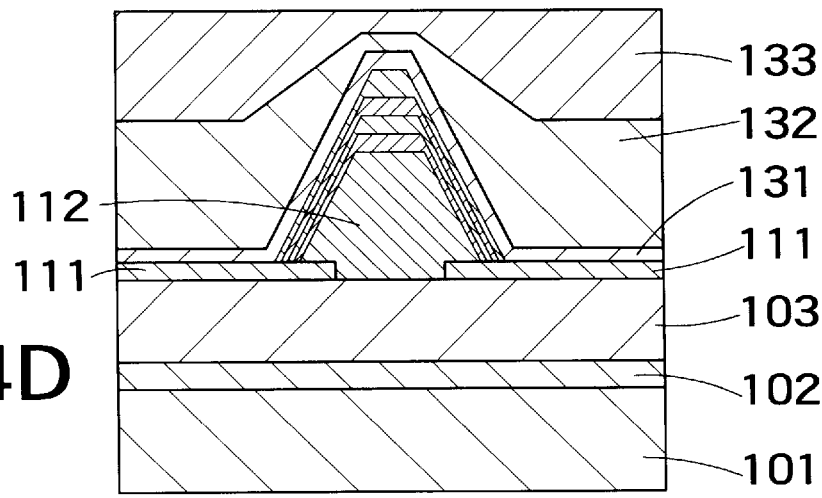

Next referring to FIG. 4D, burying growth is executed. In substantially the same manner as explained with reference to FIGS. 1A and 1B, a second buffer layer 131 is grown under a growth temperature from 400 to 600° C. The buffer layer 131 is polycrystalline when grown, but re-crystallized into a single crystal when the temperature is increased to 1000 through 1200° C. later. Next stacked thereon are a p-type layer 132 and a p-type contact layer 133 in sequence.

As explained above, by interposing a buffer layer grown at a low temperature, a high-quality crystal can be epitaxially grown on an insulation film.

The buffer layer 131 cannot be stacked thickly because it must be re-crystallized later as explained above. However, by growing the overlying p-type layer 132 and p-type contact layer 133 to a sufficient thickness, the selectively-grown region can be buried to flatten the surface of the element. After that, electrodes and a protective film, not shown, are formed to complete the light emitting element according to the invention.

Also the light emitting element shown here can confine current and light with a remarkably high efficiency like those shown before. That is, highly efficient confinement of current is realized by insulating the active layer 114 with the insulation film 111, and confinement of light with a remarkably high efficiency is realized by locally increasing the refractive index of the active layer in the region with a high mole fraction of indium made by utilizing the characteristics of selective growth. Moreover, since the mole fraction of indium is realized by utilizing the characteristics of selective growth, the active layer with a good crystalline quality and a high mole fraction of indium can be grown at a relatively high growth temperature without decreasing the growth temperature as conventionally required.

Additionally, since the grown surface is made substantially flat by burying growth, leakage of current caused by the surface morphology does not occur.

Next explained is the third modified example of the invention.

Figure 6A:
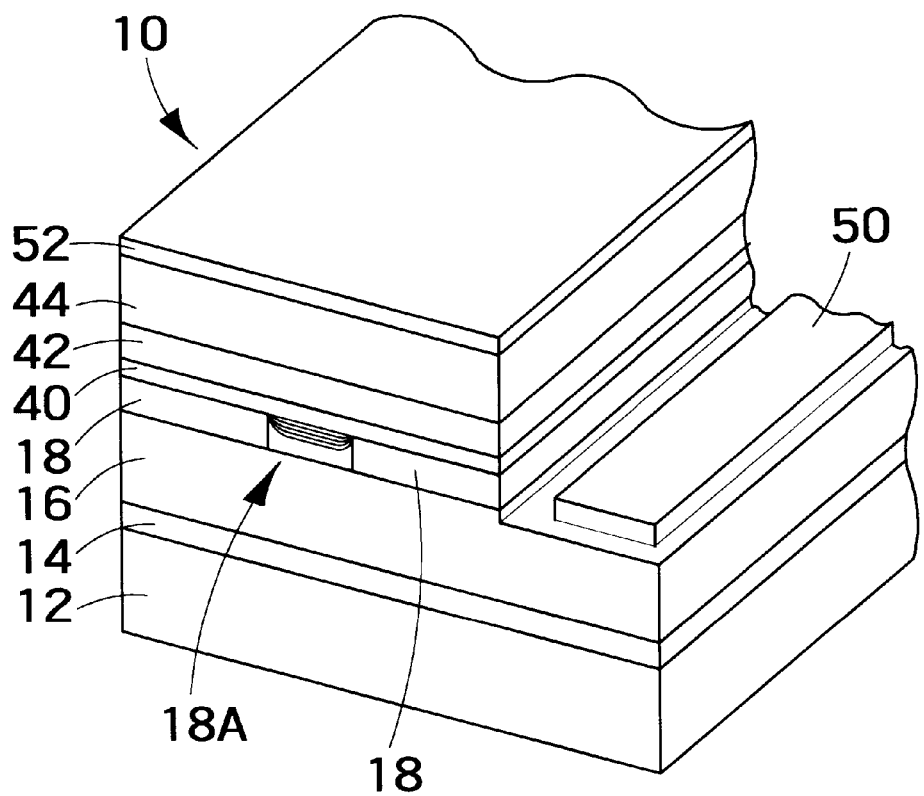
FIGS. 6A and 6B are, respectively, a perspective view and a fragmentary side elevational view schematically showing construction of a third modified nitride compound semiconductor light emitting element according to the invention.
Figure 6B:
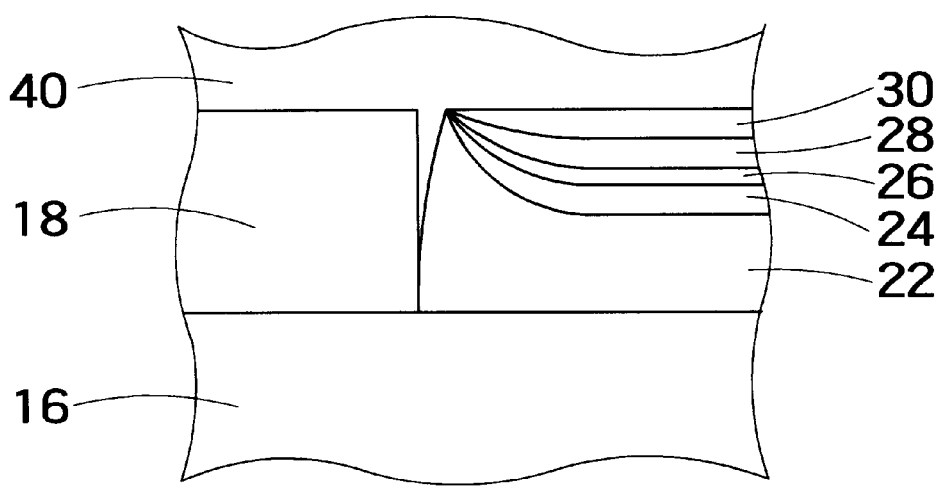

FIGS. 6A and 6B are diagrams schematically showing a construction of a nitride compound semiconductor light emitting element embodying the invention. FIG. 6A is a perspective view, and FIG. 6B is a fragmentary side-elevational view of the part around an active layer. The light emitting element according to the invention has a multi-layered structure made by sequentially stacking a plurality of semiconductor layers on a substrate 12. The material of each layer may be essentially the same as those described with the FIG. 1A and FIG. 1B. The multi-layered structure includes a double-heterostructure. The double-heterostructure contains an n-type cladding layer 24, active layer 26, and p-type cladding layer 28. The cladding layers 24 and 28 may be formed of AlGaN. The active layer 26 may be a multiple-quantum well including 15 pairs of InGaN well layers and GaN barrier layers. The feature of the example is that the double-heterostructure is formed inside the stripe opening 18A of the mask layer 18 so that the active layer 26 is interposed between the two opposite edges of the mask layer 18.

The unique structure shown in FIG. 6A and 6B is realized by stopping the growth of the buffer layer 22 at the stage exemplary shown in FIG. 5A and growing the layers 24–30 to bury the arcuately depressed central portion of the buffer layer 22. Then the second buffer layer 40, the p-type burying layer 42 and the p-type contact layer 44 is grown in sequence.

The exemplary thickness of the mask layer 18 ranges from 300 nm through 500 nm. The exemplary thickness of the n-type cladding layer 24 is less than 200 nm, which should be decided according to the thicknesses of the other layers. The thicknesses of the InGaN well layers and the GaN barrier layers may be 2–3 nm and 6–7 nm, respectively.

By growing the buffer layer 22 and the active layer 26 selectively inside the opening of the mask layer 18 formed on the substrate and by growing additional layers to bury the entirety and to flatten the surface, a planar-type, stripe-buried structure is realized. The active layer 26 having formed a distribution of refractive index by utilizing a distribution of thickness thereof as a result of selective growth can confine light with high efficiency. Additionally, by using an insulation film, highly efficient confinement of current is realized to provide a light emitting element for a shorter wavelength with a high luminous intensity and a low oscillation threshold value.

Further, the semiconductor laser shown in the figures has very strong transverse optical confinement. The reason is explained below:

The refractive index of the InGaN well layer in the active layer 26 is expressed as 2.67+0.23x where x denotes the composition ratio of the indium as in the formula $In_xGa_{1-x}N$. Therefore, the refractive index of the active layer 26 is higher than 2.0 in most case. In contrast with this, the refractive index of the mask layer 18 can be much lower than that of the active layer 26. For example, the refractive index of $SiO_2$, which is one of the most feasible material for the mask layer 18, is as low as 1.64. By surrounding the active layer with this lower refractive index material as shown in the figure, the strong optical confinement is realized. The light emitted from the active layer 26 is strongly confined along the planar direction because the active layer 26 is interposed between the two opposite edges of the mask layer 18 which has a much larger refractive index. As a result, a highly controlled transverse mode emission is realized. This is especially advantageous for the data reading and data writing applications such as DVD (digital versatile disc) and CD (compact disc).

Although the invention has been explained by way of some specific examples, the invention is not limited to them. For example, the material of the substrate need not be sapphire, but may be any of insulating materials such as spinel, ScAlMgO, LaSrGaO$_4$ and (LaSr) (AlTa)O$_3$ or conductive materials such as SiC, MgO and Si, for example. If a ScAlMgO$_4$ substrate is used, its (0001)-oriented surface is preferably used as its major surface. If a (LaSr) (AlTa)O$_3$ substrate is used, its (111)-oriented surface is preferably used.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A nitride compound semiconductor light emitting element comprising:
    a substrate;
    a nitride compound semiconductor n-type layer formed on said substrate;
    a mask layer formed on said n-type layer and having a predetermined opening;
    a nitride compound semiconductor buffer layer epitaxially grown on said n-type layer exclusively at said opening and having a recess on its top face so that a thickness of said buffer layer is thinner in a location above a central portion of said opening while a thickness of said buffer layer is thicker at locations above edge portions of said opening;
    a nitride compound semiconductor active layer selectively formed on said recess of said buffer layer, said active layer being thicker in a location above the central portion of said recess and thinner in locations above the edges of said recess; and
    a nitride compound semiconductor burying layer overlaying said mask layer and said active layer to cover said active layer.

2. The nitride compound semiconductor light emitting element according to claim 1, wherein said active layer contains indium and has a distribution of mole fraction of indium higher in a location above a central portion of said recess and lower in locations above edges of said recess.

3. The nitride compound semiconductor light emitting element according to claim 2, further comprising:
    an n-type nitride compound semiconductor cladding layer selectively stacked between said buffer layer and said active layer; and
    a p-type nitride compound semiconductor cladding layer stacked between said active layer and said burying layer,
    wherein said substrate is made of sapphire and said opening is stripe-shaped.

4. The nitride compound semiconductor light emitting element according to claim 3, wherein said mask layer is made of an insulator.

5. The nitride compound semiconductor light emitting element according to claim 4, wherein said stripe-shaped opening has a width not larger than 5 µm.

6. A nitride compound semiconductor light emitting element comprising:
    a substrate;
    a nitride compound semiconductor n-type layer formed on said substrate;
    a mask layer formed on said substrate and having an opening;
    a nitride compound semiconductor first cladding layer stacked on the entire surface of said mask layer involving said opening and having a recess on its top surface in a location above said opening;
    a nitride compound semiconductor active layer stacked on said first cladding layer; and
    a nitride compound semiconductor second cladding layer stacked on said active layer, said active layer being thicker in a location above a central portion of said recess and thinner in locations above edges of said recess.

7. The nitride compound semiconductor light emitting element according to claim 6 wherein said active layer contains indium and has a distribution of mole fraction of indium higher in a location above a central portion of said recess and lower in locations above edges of said recess.

8. A nitride compound semiconductor light emitting element comprising:
    a substrate;
    a mask layer formed on said substrate and having an opening;
    a nitride compound semiconductor buffer layer selectively grown in said opening to project in a form of a pyramid so that said buffer layer is thicker in a location above a central portion of said opening and thinner in locations above edges of said opening;
    selectively-grown layers selectively grown on said buffer layer and containing at least a first nitride compound semiconductor cladding layer, a nitride compound semiconductor active layer and a second nitride compound semiconductor cladding layer which are stacked one over another; and
    a nitride compound semiconductor burying layer grown on said mask layer and said selectively-grown layers to overlay said selectively-grown layer, said active layer being thicker in a location above a central portion of said opening and thinner in locations above edges of said opening.

9. The nitride compound semiconductor light emitting element according to claim 8, wherein said active layer contains indium and has a distribution of mole fraction of indium higher in a location above a central portion of said opening and lower in locations above edges of said opening.

10. A nitride compound semiconductor light emitting element comprising:
    a substrate;
    a mask layer formed on said substrate and having a predetermined opening;
    a nitride compound semiconductor buffer layer selectively formed inside said opening, said buffer layer being thinner in a location at a central portion of said opening and thicker at locations near edge portions of said opening;
    a nitride compound semiconductor active layer selectively formed on said buffer layer inside said opening and being thicker in a location at the central portion of said opening and thinner in locations near the edges of said opening; and
    a nitride compound semiconductor burying layer grown on said mask layer and said active layer to cover said active layer,
    wherein said active layer is interposed between two edges of said mask layer and said active layer contains indium with a distribution of mole fraction higher in a location at a central portion of said opening and lower in locations near opposite edges of said opening.

11. The nitride compound semiconductor light emitting element according to claim 10, wherein said mask layer is made of an insulator.

12. The nitride compound semiconductor light emitting element according to claim 4, wherein said insulator is selected from the group consisting of silicon oxide, silicon nitride, aluminum oxide, silicon carbide, and aluminum nitride.

13. The nitride compound semiconductor light emitting element according to claim 7, wherein said mask layer is made of an insulator.

14. The nitride compound semiconductor light emitting element according to claim 13, wherein said insulator is selected from the group consisting of silicon oxide, silicon nitride, aluminum oxide, silicon carbide, and aluminum nitride.

15. The nitride compound semiconductor light emitting element according to claim 7, wherein said mask layer is made of an n-type nitride compound semiconductor.

16. The nitride compound semiconductor light emitting element according to claim 9, wherein said mask layer is made of an insulator.

17. The nitride compound semiconductor light emitting element according to claim 16, wherein said insulator is selected from the group consisting of silicon oxide, silicon nitride, aluminum oxide, silicon carbide, and aluminum nitride.

18. The nitride compound semiconductor light emitting element according to claim 11, wherein said insulator is selected from the group consisting of silicon oxide, silicon nitride, aluminum oxide, silicon carbide, and aluminum nitride.

* * * * *